United States Patent [19]

Hofer

[11] 3,895,135

[45] July 15, 1975

[54] MASKING PROCESS WITH CONSTRICTED FLOW PATH FOR COATING

[75] Inventor: Peter H. Hofer, Berkeley Heights, N.J.

[73] Assignee: Union Carbide Corporation, New York, N.Y.

[22] Filed: May 1, 1973

[21] Appl. No.: 356,213

[52] U.S. Cl. .................................. 427/248; 427/154

[51] Int. Cl. ............................................... B44d 1/52

[58] Field of Search .......... 117/8.5, 37 R, 38, 106 R

[56] References Cited

UNITED STATES PATENTS

| | | | |
|---|---|---|---|
| 3,301,707 | 1/1967 | Loeb et al. | 117/227 |
| 3,342,754 | 9/1967 | Gorham | 260/2 |
| 3,379,803 | 4/1968 | Tittmann et al. | 264/81 |
| 3,472,795 | 10/1969 | Tittmann et al. | 260/2 |

*Primary Examiner*—Thomas J. Herbert, Jr.
*Assistant Examiner*—Bruce H. Hess
*Attorney, Agent, or Firm*—William Raymond Moran

[57] ABSTRACT

A masking process, during the vapor deposition coating of a partially masked substrate with a condensible vaporous precursor of a coating material, which comprises causing the vaporous precursor to flow through a constricted flow path at the masked/unmasked interface during the coating process so as to provide a relatively thin coating at the end of the flow path which can be used as a tear line for removing the coating masking means along such interface.

18 Claims, 6 Drawing Figures

MASKING PROCESS WITH CONSTRICTED FLOW PATH FOR COATING

BACKGROUND OF THE INVENTION

1. Field of the Invention

The invention relates to the coating of. partially masked substrates with coatings formed from condensible, vaporous precursors.

2. Description of the Prior Art

Various types of coatings are applied to substrates in a vapor deposition process in which condensible, vaporous precursors of the coating material are caused to condense on, and coat, the surface. One class of such coating materials is the para-xylene-polymers which are formed from a vaporous diradical which is condensed to form the polymer. These polymers are commonly employed to coat or encapsulate various types of substrates. In some appications, it is necessary to mask defined areas on certain types of substrates in order to prevent the deposition of the coating on such defined areas during the coating operation. Such substrates which must be masked for this purpose include electrical circuitboards, hybrid circuits, and electrical components and modules. It may also be necessary to mask non-electrical substrates which require a masking/demasking operation in conjunction with the use of adhesives in an assemblying operation.

The exposed electrical contacts and connectors on the surface of circuit board substrates must be masked, for example, before the coating operation, and the masking must be removed by mechanical stripping before the coated substrate can then be put to its intended use. The cost incurred heretofore by the masking-/demasking process can account, in many applications, for at least about 20 to 50% of the total cost of the coating. Such costs have curtailed, to some extent, the use of these coating materials for various coating applications which could not stand such costs. A more simplified and effective masking process was sought, therefore, in order to expand the field of use of these coating materials.

SUMMARY OF THE INVENTION

It has now been found that a relatively simple and effective masking process is provided when coating a portion of the surface of a substrate with a coating formed from a condensible vaporous precursor by first masking that portion of the surface which is not to be coated so as to provide a constricted flow path for the vaporous precursor along the interface between the masked and unmasked surfaces of the substrate, and then causing the vaporous precursor to flow through the constricted flow path during the coating process so as to form a relatively thin coating at the end of the flow path which can be used as a tear line for removing the coated masking means along such interface.

An object of the present invention is to provide a masking process which will facilitate the use of coatings formed in a vapor deposition process from a condensible, vaporous precursor to the coating material.

DESCRIPTION OF THE PREFERRED EMBODIMENT

Figure 1:
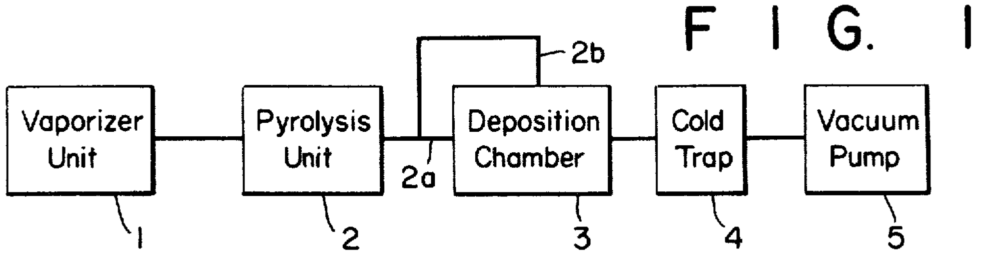
FIG. 1 shows a schematic flow sheet of a p-xylylene polymer coating device arrangement.

The Basic Process of the Present Invention

The basic process of the present invention may be more explicitly defined as a masking process for masking a defined area on the surface of a substrate which is to be coated on its unmasked surfaces with a condensing coating material during the vapor deposition coating of such substrate with such coating material which comprises providing, on such surface and at the edges of such defined area by masking means, a constricted flow path for the vaporous precursor of the coating material, such constricted flow path having a first end adjacent the area of such surface which is to be coated, and a second end which continuously edges such defined area, and a length to height ratio of at least 60:1, and preferably of > 120:1, applying the vaporous precursor to the substrate so as to cause it to condense thereon and continuously and evenly coat the masking means and the unmasked surface of the substrate, and permeate the constricted flow path and condense therein so as to form a continuous and progressively thinner coating on the surface of such substrate from the first end to the second end of such constricted flow path and thereby provide a coating which is thinnest at the edges of such defined area, and applying shearing force to the coating along such edges of the defined area so as to tear the coated masking means from such surface, thereby rendering the defined area uncoated and the remainder of the surface coated with the coating material.

The preferred coating materials for use in the process of the present invention are linear paraxylylene polymers, and the remaining description of the process of the present invention will be principally based on the use of such polymers in this process.

General Preparation of Para-Xylylene Polymers

Linear para-xylylene polymers are usually prepared by condensing, in a condensation zone, vapors of p-xylylene monomers which can be produced by the pyrolytic cleavage, in a pyrolysis zone, of one or more cyclic dimers represented by the following structure:

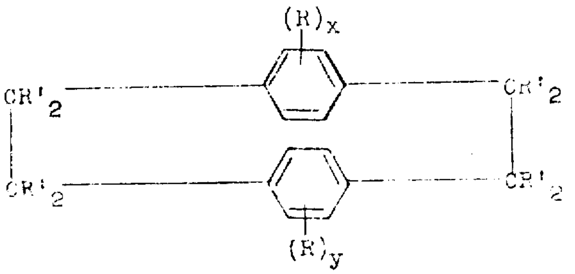

wherein R is an aromatic nuclear substituent, $x$ and $y$ are each integers from 0 to 3, inclusive, and R' is H, Cl and/or F. The thus formed vaporous p-xylylene moiety may be in the form of diradicals having the structures

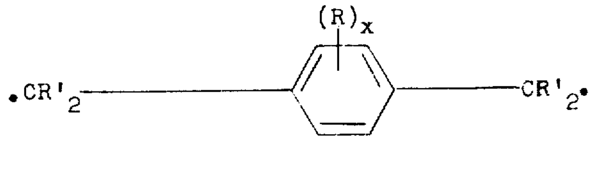

and

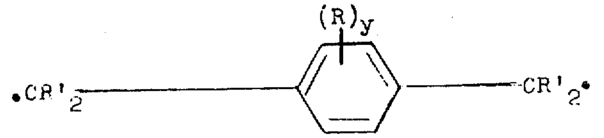

and/or moieties having the tetraene or quinoid structures:

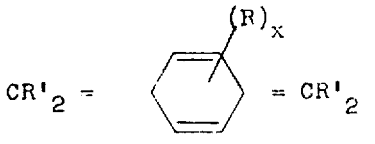

and

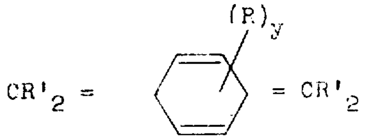

It is believed that the tetraene or quinoid structure is the dominant structure which results when the dimer is pyrolyzed, but that the monomer polymerizes as though it were in the diradical form.

Thus, where $x$ and $y$ are the same, and the aromatic nuclear substituent on each monomer is the same, and all the R's are the same, two moles of the same p-xylylene monomer are formed, and when condensed, yield a substituted or unsubstituted p-xylylene homopolymer. When $x$ and $y$ are different or the aromatic nuclear substituents on each p-xylylene monomer are different, or the R's are different, condensation of such monomers will yield copolymers as hereinafter set forth. Examples of the R substituent groups which may be present in the dimers and monomers are organic groups such as alkyl, aryl, alkenyl, cyano, alkoxy, hydroxy alkyl, carbalkoxy and like radicals and inorganic radicals such as hydroxyl, halogen and amino groups. COOH, $NO_2$ and $SO_3H$ groups may be added as R groups to the polymer after it is formed. The unsubstituted positions on the aromatic rings are occupied by hydrogen atoms.

The particularly preferred substituent R groups are the $C_1$ to $C_{10}$ hydrocarbon groups, such as the lower alkyls, i.e., methyl, ethyl, propyl, butyl and hexyl, and aryl hydrocarbons such as phenyl, alkylated phenyl, naphthyl and like groups; and the halogen groups, chlorine, bromine, iodine and fluorine. Hereinafter the term "a di-p-xylylene" refers to any substituted or unsubstituted cyclic di-p-xylylene as hereinabove discussed.

Condensation of the p-xylylene monomers to form the p-xylylene polymers can be accomplished at any temperature below the decomposition temperature of the polymer, i.e. at $< 250°C$. The condensation of the monomers will proceed at a faster rate, the colder is the substrate on which the condensation is to take place. Above certain temperatures, which might be defined as a ceiling condensation temperature, the monomers will condense at rates which are relatively slow for commercial applications. Each has a different ceiling condensation temperature. For example, at 0.5 mm Hg pressure the following condensation and polymerizations ceilings are observed for the following monomers:

| | Degrees centrigrade |
|---|---|
| p-Xylylene | 25–30 |
| Chloro-p-xylylene | 70–80 |
| Cyano-p-xylylene | 120–130 |
| n-Butyl-p-xylylene | 130–140 |
| Iodo-p-xylylene | 180–200 |

Thus, homopolymers may be made by maintaining the substrate surface at a temperature below the ceiling condensation temperature of the particular monomer species involved, or desired in the homopolymer. This is most appropriately termed "homopolymerizing conditions."

Where several different monomers existing in the pyrolyzed mixture have different vapor pressure and condensation characteristics as for example p-xylylene, or cyano-p-xylylene and chloro-p-xylylene, or any other mixture thereof with other substituted p-xylylenes, homopolymerization will result when the condensation and polymerization temperature is selected to be at or below that temperature at which only one of the monomers condenses and polymerizes. Thus, for the purpose of this invention the term "under homopolymerization conditions" is intended to include those conditions where only homopolymers are formed.

Therefore it is possible to make homopolymers from a mixture containing one or more of the substituted monomers when any other monomers present have different condensation or vapor pressure characteristics, and wherein only one monomer species is condensed and polymerized on the substrate surface. Of course, other monomer species not condensed on the substrate surface can be drawn through the apparatus as hereinafter described in vaporous form to be condensed and polymerized in a subsequent cold trap.

Inasmuch as the p-xylylene monomers, for example, are condensed at temperatures of about 25° to 30°C., which is much lower than that at which the cyano p-xylylene monomers condense, i.e., about 120° to 130°C., it is possible to have such p-xylylene monomers present in the vaporous pyrolyzed mixture along with the cyano-substituted p-xylylene monomers when a homopolymer of the substituted dimer is desired. In such a case, homopolymerizing conditions for the cyano p-xylylene monomers are secured by maintaining the substrate surface at a temperature below the ceiling condensation temperature of the substituted p-xylylene but above that of the unsubstituted p-xylylene; thus permitting the unsubstituted p-xylylene vapors to pass through the apparatus without condensing and polymerizing, but collecting the poly-p-xylylene in a subsequent cold trap.

It is also possible to obtain substituted copolymers through the pyrolysis process hereinabove described. Copolymers of p-xylylene and substituted p-xylylene monomers, as well as copolymers of substituted p-xylylene monomers wherein the substituted groups are all the same radicals but wherein each monomer contains a different number of substituent groups, can all be obtained through such pyrolysis process.

Copolymerization also occurs simultaneously with condensation, upon cooling of the vaporous mixture of reactive monomers to a temperature below about 200°C. under polymerization conditions.

Copolymers can be made by maintaining the substrate surface at a temperature below the ceiling condensation temperature of the lowest boiling monomer desired in the copolymer, such as at room temperature or below. This is considered "copolymerizing conditions," since at least two of the monomers will condense and copolymerize in a random copolymer at such temperature.

In the pyrolytic process, the reactive monomers are prepared by pyrolyzing a substituted and/or unsubstituted di-para-xylylene at a temperature less than about 750°C., and preferably at a temperature between about 600° to about 680°C. At such temperatures, essentially quantitative yields of the reactive monomers are secured. Pyrolysis of the starting di-p-xylylene begins at about 450°C. regardless of the pressure employed. Operation in the range of 450°–550°C. serves only to increase the time of reaction and lessen the yield of polymer secured. At temperatures above about 750°C., cleavage of the substituent group can occur, resulting in a tri-/or polyfunctional species causing cross-linking or highly branched polymers.

The pyrolysis temperature is essentially independent of the operating pressure. It is preferred, however that reduced or subatmospheric pressures be employed. For most operations, pressures within the range of 0.0001 to 10 mm Hg absolute are most practical. However, if desired, greater pressures can be employed. Likewise, if desirable, inert vaporous diluents such as nitrogen, argon, carbon dioxide, steam and the like can be employed to vary the optimum temperature of operation or to change the total effective pressure in the system.

When the vapors condense on the substrate to form the polymer, i.e., coating, the coating forms as a continuous film of uniform thickness. The coatings are transparent and pinhole free. The thickness of the coating can be varied by various procedures, as by varying the amount of dimer used, and by varying the reaction temperature, time, pressure and substrate temperature.

In addition to the linear para-xylylene polymers, other coating materials which are usually formed in a vapor deposition process may be used in the process of the present invention.

Masking Means

The masking means which is used in the process of the present invention to mask those areas of the surface of the substrate which are not to be coated include all the conventional masking means, such as masking tape, paper, polyethylene, vinyl resins, polytetrafluoroethylene, acetate resin, cellophane, woven tapes, foils, silicone rubber, and laminates made of resins such as epoxy resins, polyester resins and phenolic resins. These laminates may be made with or without structural reinforcing elements.

Adhesives, clamps, clips, spring loaded holders, shrinkfit devices, and the like, may be used to secure the masking means to the surfaces being coated during the coating operation.

The masking means may be used in the form of thin sheets or film which are about 0.0005 to 0.020 inches thick, or in the form of thicker sleeves, templates, and the like. The masking means may be molded or machined to conform to the configuration of the substrate being masked therewith, and they can be reusable.

Masking Process Para-Xylylene Polymers

A more detailed understanding of the masking process of the present invention, in which para-xylylene polymers are employed as the coating materials, may be obtained by now referring to the drawings.

FIG. 1 of the drawings shows a schematic view of various parts of equipment that may be used, in combination, in carrying out the masking process of the present invention. Thus, the vaporization of the p-xylylene dimer is conducted in a vaporizer unit 1. The vapors are then conducted to a pyrolysis unit 2 for the purposes of pyrolyzing the vaporous cyclic dimer to form, per mol of dimer, two mols of the p-xylylene moiety. The p-xylylene vapors are then passed into deposition chamber 3, wherein the novel process of the present invention is essentially conducted. Unreacted p-xylylene vapors pass through deposition chamber 3 into a cold trap 4 where they are condensed. The entire series of elements 1 through 4 is connected in series to vacuum pump 5 which is used to maintain the desired pressure conditions throughout the interconnected system of devices, and also to help cause the dimer and p-xylylene vapors to flow in the desired direction. Valves may be inserted between the adjoining devices in the system to regulate the flow of the vapors.

For the purposes of the present invention the p-xylylene vapors are usually fed to deposition chamber 3 through the side thereof, through line 2*a* and/or through the top thereof, through line 2*b*.

Figure 2:
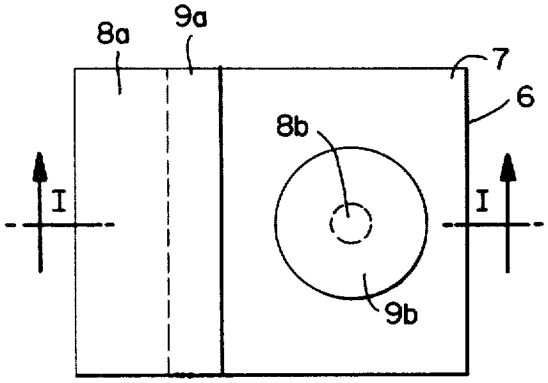
FIG. 2 shows a top view of a circuit board with a portion of the surface thereof masked in accordance with the present invention.
Figure 3:
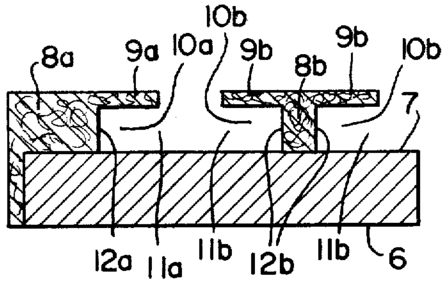
FIG. 3 shows a cross-section of the masked circuit board of FIG. 2, through section I—I thereof.

FIG. 2 shows a top view and FIG. 3 shows a cross-sectional view, through section I—I of FIG. 2, of a circuit board 6 having a upper surface 7. On upper surface 7 there are placed masking means 8*a* and 8*b* which have lipped edges 9*a* and 9*b*, respectively. Lipped edges 9*a* and 9*b* provide, in combination with the underlying areas of surface 7, constricted flow paths 10*a* and 10*b*, respectively. Each of these constricted flow paths 10*a* and 10*b* thus have one end, 11*a* and 11*b* respectively, which is adjacent, and open to, the unmasked areas of surface 7, and a second end, 12*a* and 12*b* respectively, which edges those areas of surface 7 which are actually covered by direct contact with the bases of masking means 8*a* and 8*b*. The bases of masking means 8*a* and 8*b* define those areas of surface 7 which are not to be coated during the subsequent coating operation.

Lipped edges 9*a* and 9*b* are so constructed as to provide constricted flow paths 10*a* and 10*b* with a length to height ratio of at least 60:1, and preferably of $>$ 120:1. The constricted flow paths are, preferably, about one-sixteenth to one-eighth inch long. The height of the flow path should be at least 0.0005 to 0.001 inch to allow the vaporous precursor of the coating material to permeate the flow path.

The constricted flow paths are preferably of uniform height through the entire length thereof, that is, those areas of surface 7 and of the undersides of lipped edges 9*a* and 9*b* which form such flow path are essentially parallel to each other. These flow path forming elements, however, can also be angled relative to each other so that they form an angle of about $\leq 10°$, with the apex of the angle being at or towards those ends of the flow paths which edge those areas of surface 7 which are actually covered by direct contact with the bases of masking 8*a* and 8*b*. Where the elements forming the flow path are so angled with respect to each other, the average of the width between them along the entire flow path, should still be such that the ratio of the length of such flow path to its average width is at least 60:1, and is preferably $>$ 120:1. The ratio for a 1° angular path is preferably about $\geq$ 80:1, for a 2° angular path, the ratio is preferably about $\geq$ 100:1, etc.

The surface of circuit board 6 usually contains exposed electrical elements such as electrical connectors, or electrical devices such as diodes, transistors, integrated circuit chips, capacitors, resistors, and the like. The existence and possible positioning of such electrical elements is not shown since it is not necessary for a proper understanding of the invention. The electrical elements which are to be coated with the coating material, however, are generally positioned within the unmasked areas of surface 7. To avoid coating such exposed electrical elements during the coating process, therefore, the surface 7 of circuit board 6 must be masked accordingly, and the configuration of the masking means can be readily tailored to accomplish this end.

When masking means 8*a* and 8*b* are in place on surface 7, the thus assembled circuit board is coated with para-xylylene polymer in deposition chamber 3 by allowing p-xylylene dimer vapors to condense and continuously and evenly polymerize, as disclosed above, on the exposed surfaces 7 of circuit board 6 and on the surfaces of masking means 8*a* and 8*b*.

Figure 4:
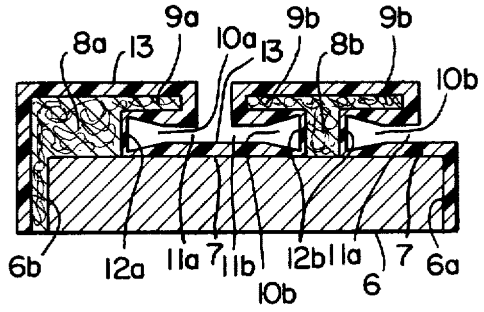
FIG. 4 shows a cross-section of the masked circuit board of FIG. 2, through section I—I thereof, after a coating operation.

FIG. 4 shows a cross-section of circuit board 6 after the coating operation, through section I—I of the circuit board as seen in FIG. 2. The unmasked surface 7 of circuit board 6, and the surfaces of masking means 8*a* and 8*b*, are now evenly coated with a continuous coating 13 of poly-para-xylylene.

During the coating operation the para-xylylene polymer forms on, and continuously and evenly coats the upper surfaces and sides of masking means 8*a* and 8*b*. The polymer also continuously and evenly coats those areas of surface 7 which are not covered directly by masking means 8*a* and 8*b*, and which are beneath constricted flow paths 10*a* and 10*b*.

None of the polmeric coating 13 forms on those areas of surface 7 which are actually covered by direct contact with the bases of masking means 8*a* and 8*b*, i.e., the unlipped portions of masking means 8*a* and 8*b*.

The vaporous precursor does permeate the constricted flow paths and condenses therein so as to cause the polymeric coating 13 to form a continuous coating on those areas of surface 7, and those of the underside of lipped edges 9*a* and 9*b*, which define the limits of constricted flow paths 10*a* and 10*b*. This portion of the polymeric coating 13 gets progressively thinner from the open ends 11*a* and 11*b* of such flow paths, i.e., those adjacent and open to the unmasked areas of surface 7, to the other ends 12*a* and 12*b* thereof, i.e., those which edge those areas of surface 7 which are actually covered by direct contact with the bases of masking means 8*a* and 8*b*. The coating material 13 thus provides a continuous coating on all of the areas of surface 7 and masking means 8*a* and 8*b* which define the limits of such flow paths, which coating 13 is thinnest at ends 12*a* and 12*b*, the edges of which ends 12*a* and 12*b* define, in effect, the areas of surface 7 which are not coated. The coating gets correspondingly progressively thinner on all the wall members which form the flow path, as the coating forms from ends 11*a* to 12*a* thereof.

After the coating operation the coated circuit board is removed from deposition chamber 3 and masking means 8*a* and 8*b* are removed thereform. This is readily accomplished by applying a shearing force to the coating 13 along ends 12*a* and 12*b* of the constricted flow paths. The relatively thin coatings at ends 12*a* and 12*b* of the constricted flow paths are of the order of about 1 to 15 microns thick, where the coating is made of para-xylylene polymer, and readily allow the coating to be torn along such ends 12*a* and 12*b*. In this way coated masking means 8*a* and 8*b* can then be removed from surface 7. Thus, those areas of surface 7 which were directly covered by contact with the unlipped bases of masking means 8*a* and 8*b* are provided in a coating-free condition.

Where coatings are provided by condensible coating materials other than the para-xylylene polymers, the thickness of such coating materials at ends 12*a* and 12*b* may be somewhat thicker than the coatings provided, at such places, by the para-xylylene polymers. Such thicker coatings at such ends 12*a* and 12*b* may be of the order of 50 to 125 microns thick.

The removal of masking means 8*a* and 8*b* by tearing the coating 13 along ends 12*a* and 12*b* of the flow paths does not disturb the integrity of the adhesion of the coating which is directly adhering to surface 7.

In FIG. 4, masking means 8*a* is shown as also covering a side 6*b* of circuit board 6. Under the usual coating conditions employed in coating substrates in a vapor deposition process with coating materials such as para-xylylene polymer, all the exposed, unmasked surfaces of the object being coated, top, sides and/or bottom, are usually coated. In the case of circuit board 6, the bottom of it was not coated, since the bottom surface was not exposed to the coating vapors. The unmasked side 6*a* of circuit board 6 was coated with coating 13 during the coating process, whereas the masked side 6*b* of the board was only coated on the mask, and not on the side of the board itself.

Figure 5:
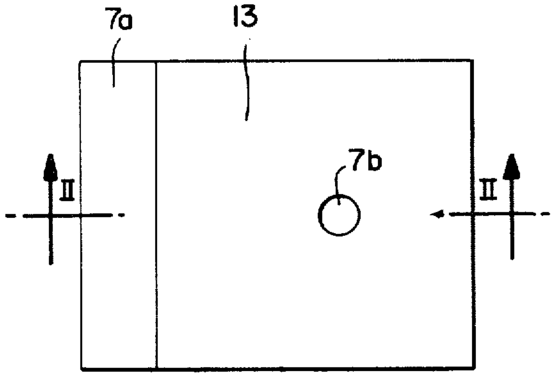
FIG. 5 shows a top view of the circuit board of FIG. 4 after the coating operation and after the removal of the coated masking means.

FIG. 5 shows a top view of circuit board 6, after the coating operation, and after coated masking means 8*a* and 8*b* have been removed from the coated circuit board as described above.

Figure 6:
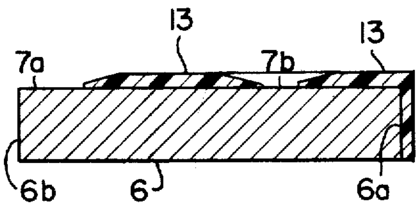
FIG. 6 shows a cross-section of the coated circuit board of FIG. 5, through section II—II thereof.

FIG. 6 shows a cross-section of circuit board 6 through section II—II of the coated, and demasked, circuit board as seen in FIG. 5.

Coating 13 now covers only that portion of surface 7 which was directly exposed to the coating vapors. Surface areas 7*a* and 7*b* of circuit board 6 are not coated with para-xylylene polymer, and they are those areas which were respectively directly covered by the unlipped portions of masking means 8*a* and masking means 8*b*.

In all the drawings the relative dimensions of the elements are not drawn to scale in order to readily describe the present invention.

The process of the present invention can thus be even more specifically defined, with respect to the use of para-xylylene polymer as the coating materials, as, a masking process for coating less than the total surface area of the surface of a substrate which is to be coated with a condensing coating material during the vapor deposition coating of such substrate with such coating material, such substrate surface comprising an Area A which is not to be coated and an adjoining Area B which is to be coated, which comprises masking all of such Area A and at least a portion of such Area B with masking means so as to provide masking means above the entire interface between such Area A and such Area B and to provide beneath at least a portion of such masking means a constricted flow path for vaporous precursor of such coating material which flow path runs along a portion of the surface of such substrate, such constricted flow path having a first end which is open to the unmasked portion of Area B, and a second end which terminates at the interface between such Area A and such Area B and a length to height ratio of at least 60 to 1, and is preferably > 120:1, applying the vaporous precursor of such coating material to such substrate so that such precursor condenses on and continuously and evenly coats the masking means and the unmasked surface of such substrate, and permeates such constricted flow path and condenses on the surfaces of such substrate and such masking means which form such constricted flow path so as to cause a continuous and progressively thinner coating to form on such flow path surfaces from the first end to the second end thereof, and thereby provide a coating which is thinnest at the interface between such Area A and such Area B, and applying shearing force to the coating along such interface so as to tear the coated masking means from such surface, thereby rendering Area A uncoated and Area B coated with such coating material.

Examples

The following examples are merely illustrative of the process of the present invention and are not intended as a limitation upon the scope thereof.

EXAMPLES 1–5

A series of five experiments were conducted to illustrate the process of the present invention. For each experiment a blank circuit board substrate was masked, coated and demasked in accordance with the present invention. The substrate was a 3 inch × 8 inch × 1/16 inch glass fiber reinforced phenolic resin laminate which is commonly used as a circuit board substrate. The substrate was devoid of any electrical circuitry.

Masking tape was used to provide the constricted flow paths. The masking tape used in each example was 1 inch wide and 0.005 inch thick. The tape used in Examples 1, 2 and 5 was Blue Cross Tape (Hampton Mfg. Co.), and the tape used in Examples 3 and 4 was aluminum foil. All the tapes had an adhesive backing.

To the bottom of each tape, metal foil measuring 0.001 inch thick × 0.125 inch wide was bonded so that the foil extended about 0.010 inch out from the base of the tape, along one length thereof. The metal foil was extended out from this edge of the tape in this way so as to insure that the adhesive on this edge of the masking tape does not later come into contact with, and mar, the coating. The adhesive on the bottom of the masking tape bonds the metal foil to the underside of the masking tape.

The metal foil in Examples 1, 4 and 5 was made of brass, and the metal foil in Examples 2 and 3 was made of aluminum.

In each experiment, a single width of the masking tape, with the metal foil bonded thereto, was then used to mask one of the 1 inch wide ends of the upper surface of the substrate in the position corresponding to masking means 8*a* as shown in FIGS. 2 and 3 of the drawings. The metal foil on the bottom of the masking tape, occupied, essentially, the lower surface of lip member 9*a* as seen in FIGS. 2 and 3. Masking tape 8*a* was thus bonded directly to the surface 7 of substrate 6, as seen in FIGS. 2 and 3. Since the bottom of lip member 9*a* had the metal foil bonded thereto, the metal foil prevented the overlying length of masking tape from being adhesively bonded to surface 7. In fact, the flat underside of lip member 9*a* was naturally separated from (and parallel to) surface 7 a distance of about 0.001 inch, so as to provide a constricted flow path 10*a*, as seen in FIG. 3, which was about 0.125 inch long.

In each experiment, the masked substrate was then placed in a para-xylylene polymer coating deposition chamber and the masked and unmasked surface of the substrate was then coated with a continuous coating of polychloropara-xylylene which was about 0.0005 to 0.0007 inches thick. In the constricted flow path, the coating was not uniform, and was as seen in FIG. 4 in flow path 10*a*, having a thickness of about 2 to 30 microns.

The coating was supplied in each experiment by charging about 35 grams of chloro-para-xylylene monomer to a vaporizer unit and vaporizing and pyrolyzing the monomer, and condensing the resulting diradical on the substrate being coataed in the deposition chamber, as described above. During the coating operation, the following conditions prevailed in the coating apparatus in each experiment:

| | |
|---|---|
| vaporizer unit temperature | 200°C. |
| pyrolysis unit temperature | 650°C. |
| deposition chamber pressure | 30–90 microns |
| cold trap temperature | –86°C. |
| vacuum pump | 3 microns |

After the coating operations, the coated substrates were removed from the deposition chamber.

The masking means, masking tape plus metal foil, shown in FIGS. 2–4 as 8*a*/9*a*, with the overlying coating 13, was then stripped from surface 7 by tearing the coating along the thinnest edge of the coating in the constricted flow path which was on surface 7. This thinnest edge was at end 12*c* of the flow path, and followed the dotted line shown in FIG. 2. A clean continuous tear line resulted leaving the coated substrate as shown in FIGS. 5 and 6, with respect to the removal of masking means 8*a*.

What is claimed is:

1. A process for masking a defined area on a substrate which is to be coated with a linear para-xylylene polymer coating material during the vapor deposition coating of such substrate with said coating material which comprises
masking said defined area so as to
provide at the edges of said defined area a constricted flow path for the vaporous precursor of said coating material,
said flow path having a first end adjacent the area of said substrate which is to be coated and a second end which edges the area of said substrate which is masked and having a length to height ratio of at least 60:1 and a height of at least 0.0005 inch
applying the vaporous precursor of said coating material to said substrate so that it
condenses thereon and evenly coats the unmasked area of said substrate, and
permeates said constricted flow path and condenses therein to form a progressively thinner coating from said first end to said second end of said flow path, and
applying shearing force to the coating along the second end of said flow path so as to tear the coating from the defined area of such surface along said edges, thereby rendering said defined area uncoated and the remainder of the surface coated with said coating material.

2. A process as in claim 1 in which said flow path has a uniform height.

3. A process as in claim 2 in which said flow path is about one-sixteenth to one-eighth inch long.

4. A process as in claim 3 in which said length to height ratio is as least 120:1.

5. A process as in claim 1 in which said coating material comprises poly-chloro-para-xylylene.

6. A process as in claim 1 in which said coating material is applied so as to coat the unmasked area of the substrate with a coating which is about 2 to 30 microns thick.

7. A process for masking a defined area on the surface of a substrate which is to be coated on the unmasked areas of such surface with a linear para-xylylene polymer coating material during the vapor deposition coating of such substrate with said coating material
which comprises
providing, on such surface and at the edges of said defined area by masking means, a constricted flow path for the vaporous precursor of said coating material,
said constricted flow path having a first end adjacent the area of said surface which is to be coated, a second end which continuously edges said defined area, and a length to height ratio of at least 60:1 and a height of at least 0.0005 inch
applying the vaporous precursor to said substrate so as to cause it to
condense thereon and continuously and evenly coat the masking means and the unmasked surface of said substrate, and
permeate said constricted flow path and condense therein so as to form a continuous and progressively thinner coating on the surface of such substrate from said first end to said second end of said constricted flow path and thereby provide a coating which is thinnest at the edges of said defined area, and
applying shearing force to the coating along the edges of the defined area so as to tear the coated masking means from said surface, thereby rendering said defined area uncoated and the remainder of the surface coated with said coating material.

8. A process as in claim 7 in which said flow path has a uniform height.

9. A process as in claim 8 in which said flow path is about one-sixteenth to one-eighth inch long.

10. A process as in claim 9 in which said length to height ratio is at least 120:1.

11. A process as in claim 7 in which said coating material comprises poly-monochloro-p-xylylene.

12. A process as in claim 7 in which said coating material is applied so as to evenly coat the unmasked surface of the substrate with a coating which is about 2 to 30 microns thick.

13. A process for coating less than the total surface area on the surface of a substrate which is to be coated with a linear para-xylylene polymer coating material during the vapor deposition coating of such substrate with said coating material,
said substrate surface comprising an Area A which is not to be coated and an adjoining Area B which is to be coated,
which comprises
masking all of said Area A and at least a portion of said Area B with masking means so as to provide
masking means above the entire interface between said Area A and said Area B and
beneath at least a portion of said masking means a constricted flow path for vaporous precursor of said coating material which runs along a portion of the surface of said substrate,
said constricted flow path having a first end which is open to the unmasked protion of Area B, and a second end which terminates at the interface between said Area A and said Area B, and a length to height ratio of at least 60 to 1, and a height of at least 0.0005 inch applying the vaporous precursor of said coating material to said substrate so that said precursor condenses on and continuously and evenly coats the masking means and the unmasked surface of said substrate, and permeates said constricted flow path and condenses on the surfaces of said substrate and said masking means which form said flow path so as to cause a continuous and progressivley thinner coating to form on said flow path surfaces from the first end to the second end thereof, and thereby provide a coating which is thinnest at the interface between said Area A and said Area B, applying shearing force to the coating along said interface so as to tear the coated masking means from said surface, thereby rendering Area A uncoated and Area B coated with said coating material.

14. A process as in claim 13 in which said flow path has a uniform height.

15. A process as in claim 14 in which said flow path is about one-sixteenth to one-eighth inch long.

16. A process as in claim 15 in which said length to height ratio is at least 120:1.

17. A process as in claim 13 in which said coating material comprises poly-monochloro-p-xylylene.

18. A process as in claim 13 in which said coating material is applied so as to evenly coat the unmasked surface of the substrate with a coating which is about 2 to 30 microns thick.

* * * * *